United States Patent
Ishikawa et al.

[19]

[11] Patent Number: 5,883,403
[45] Date of Patent: *Mar. 16, 1999

[54] POWER SEMICONDUCTOR DEVICE

[75] Inventors: Katsumi Ishikawa; Katsuaki Saito; Yutaka Sato, all of Hitachi; Atsuo Watanabe, Hitachiota; Shuji Katoh; Naohiro Momma, both of Hitachi, all of Japan

[73] Assignee: Hitachi, Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 720,017

[22] Filed: Sep. 27, 1996

[30] Foreign Application Priority Data

Oct. 3, 1995 [JP] Japan ..................................... 7-255971
Feb. 29, 1996 [JP] Japan ..................................... 8-042431

[51] Int. Cl.$^6$ ........................... H01L 29/74; H01L 31/111
[52] U.S. Cl. .......................... 257/156; 257/109; 257/113; 257/131; 257/611; 257/617; 257/913
[58] Field of Search ..................... 257/113, 131, 257/142, 156, 611, 913, 109, 617

[56] References Cited

U.S. PATENT DOCUMENTS

| 4,195,306 | 3/1980 | Fullmann et al. | 257/156 |
| 4,500,902 | 2/1985 | Herberg | 257/156 |
| 5,001,535 | 3/1991 | Nishizawa et al. | 257/156 |
| 5,075,751 | 12/1991 | Tomii et al. | 257/136 |

FOREIGN PATENT DOCUMENTS 57-39577 3/1982 Japan.
60-198778 10/1985 Japan.

OTHER PUBLICATIONS

Wolf et al., Silicon Processing for the VSLI Era (vol. 1: Process Technology), Silicon: Single Crystal Growth and Wafer Preparation (Trends in Silicon Crystal Growth and VSLI Wafers, pp. 32–33, 1986.

*Primary Examiner*—Ngân V. Ngô
*Attorney, Agent, or Firm*—Antonelli, Terry, Stout & Kraus, LLP

[57] ABSTRACT

In a semiconductor device, such as a diode and thyristor, having at least one pn junction between a pair of main surfaces, a first main electrode formed on the surface of one of the main surfaces and a second main electrode formed on the surface of the other one of the main surfaces, a semiconductor lattice defect is formed such that its lattice defect density increases gradually in the direction from the first main electrode to the second main electrode. Since the distribution of the carrier density in the conduction state can be flattened, the reverse recovery charge can be reduced substantially without causing the ON-state voltage to increase.

18 Claims, 14 Drawing Sheets

POWER SEMICONDUCTOR DEVICE

BACKGROUND OF THE INVENTION

The present invention relates to a power semiconductor device such as a diode and thyristor.

In such a system which handles a large power as a power converter or inverter, a high breakdown voltage, large current capacity semiconductor devices are used. As a high breakdown voltage semiconductor device, there are such devices as a diode, thyristor, GTO thyristor, reverse conducting thyristor and the like which has a laminated structure of a plurality of p-type and n-type semiconductors.

In these semiconductor devices, it is desirable for both characteristics of ON-state voltage $V_T$ applied across both sides of a semiconductor device in conduction state, and of reverse recovery charge $Q_r$ which is a total charge which flows in the reverse direction at the time of switching from the conduction state to the blocking state to be substantially small. Lifetime of carriers within the device is one of the major factors that determine these two characteristics described above. The longer the lifetime the lower the ON-state voltage $V_T$ becomes while the shorter the lifetime the smaller the reverse recovery charge $Q_r$ becomes, thereby, these two characteristics are in a trade-off relationship from each other.

As means for controlling the lifetime, there are known methods such as diffusion of heavy metals such as gold, platinum or the like, and irradiation of radiation rays. In the case where lifetime in a device is shortened by irradiation of γ rays or electron beam, its lifetime in the depth direction of the device is uniformly shortened. Thereby, although its reverse recovery charge can be reduced, an increase in its ON-state voltage cannot be avoided. As means for improving these characteristics in semiconductor devices by locally controlling the lifetime, there are disclosed prior art in JP-A-57-39577 and JP-A-60-198778.

The prior art of JP-A-57-39577 discloses a method of irradiating protons from the main surface of a thyristor to form lattice defect in a region in which a depletion layer expands in the vicinity of pn junction on the anode side to which a reverse voltage is applied at the time of turn-off operation such that lifetime in the device is locally shortened. Further, the prior art of JP-A-60-198778 discloses a method of locally shortening lifetime in one of two regions which form pn junction to which a reverse voltage is applied at the time of turn off switching, and in particular, in an area of the one of two regions having a smaller impurity concentration in the vicinity of the junction where a depletion layer expands.

Both of these prior arts are directed to reducing reverse recovery charge $Q_r$ while suppressing an increase of ON-state voltage $V_T$ to a small value by rapidly reducing carriers in the region where a depletion layer will expand at the turn off switching operation so as to be able to form the depletion layer rapidly.

FIG. 5 shows a result of calculation of a distribution of carrier density in conduction state made by the present authors in a case where lifetime in the vicinity of pn junction on the anode side is locally shortened according to the prior art of JP-A-57-39577. By way of example, in the drawing of FIG. 5, a position at 0 μm is a surface of n-emitter layer on the cathode side, and a position at 1520 μm is a surface of p-emitter layer on the anode side (the same applies to FIG. 6). Further, a distribution of impurity concentration used in the calculation is shown in FIG. 2, which will be explained later (the same applies to FIG. 6). In this case, since a carrier density in a region in the vicinity of pn junction on the anode side where its lifetime is locally shortened is lowered, thereby, since a resistance component in inverse proportion to the carrier density increases, ON-state voltage $V_T$ will increase consequently.

Further, FIG. 6 shows a result of calculation of a distribution of carrier density in conduction state made by the present authors in a case where lifetime in an n-base region is shortened according to JP-A-60-198778. In this case, since a carrier density in conduction state in the p-emitter layer is high, reverse recovery charge $Q_r$ is not reduced effectively.

SUMMARY OF THE INVENTION

A semiconductor device according to the present invention has at least one pn junction between a pair of main surfaces. Then, lattice defects are formed in the direction from a first electrode formed on one of the pair of the main surfaces toward a second electrode formed on the other one of the pair of the main surfaces such that its lattice defect density increases gradually toward the second electrode.

Further, the semiconductor device according to the present invention is formed to have a first conductive type first emitter layer, a second conductive type first base layer, a first conductive type second base layer, and a second conductive type second emitter layer, sequentially adjacent to one another. Further, a first main electrode is formed on the main surface of the first emitter layer, and a second main electrode on the main surface of the second emitter layer. Further, lattice defects are formed such that its lattice defect density increases gradually from the first main electrode to the second main electrode.

According to such distribution of lattice defects according to the invention, a carrier distribution within the device in conduction state can be flattened substantially. Thereby, the reverse recovery charge can be reduced substantially without increasing the ON-state voltage.

Further, a semiconductor device according to the first aspect of the invention having the first conductive type first emitter layer, the second conductive type first base layer, the first conductive type second base layer and the second conductive type second emitter layer which are sequentially formed adjacent to one another is characterized by comprising a region in which lifetime of carriers in the depth direction of the substrate extending from the second main electrode to the first main electrode becomes shortened on the second emitter side.

Further, a semiconductor device according to the second aspect of the invention having the first conductive type first emitter layer, the second conductive type first base layer, the first conductive type second base layer and the second conductive type second emitter layer which are sequentially formed adjacent to one another is characterized by comprising a first region within the second emitter layer the lifetime in which is shorter than those in other regions within the second emitter layer, and a second region within the second base layer the lifetime in which is shorter than those in other regions within the second base layer, and wherein the lifetime in the first region is shorter than the lifetime in the second region.

Still further, a semiconductor device according to the third aspect of the invention having the first conductive type first emitter layer, the second conductive type first base layer, the first conductive type second base layer and the second conductive type second emitter layer which are sequentially formed adjacent to one another is characterized by comprising a region in which its lifetime in the direction of substrate from within the second emitter layer to the first emitter layer becomes shorter sequentially and continuously.

According to the distribution of respective lifetimes according to the invention as described above, carrier densities in conduction state can be reduced as they are distributed substantially uniformly from the first emitter layer to the second emitter layer. Thereby, reverse recovery charge $Q_r$ can be reduced without increasing ON-state voltage $V_T$.

DESCRIPTION OF THE PREFERRED EMBODIMENTS

Figure 1:
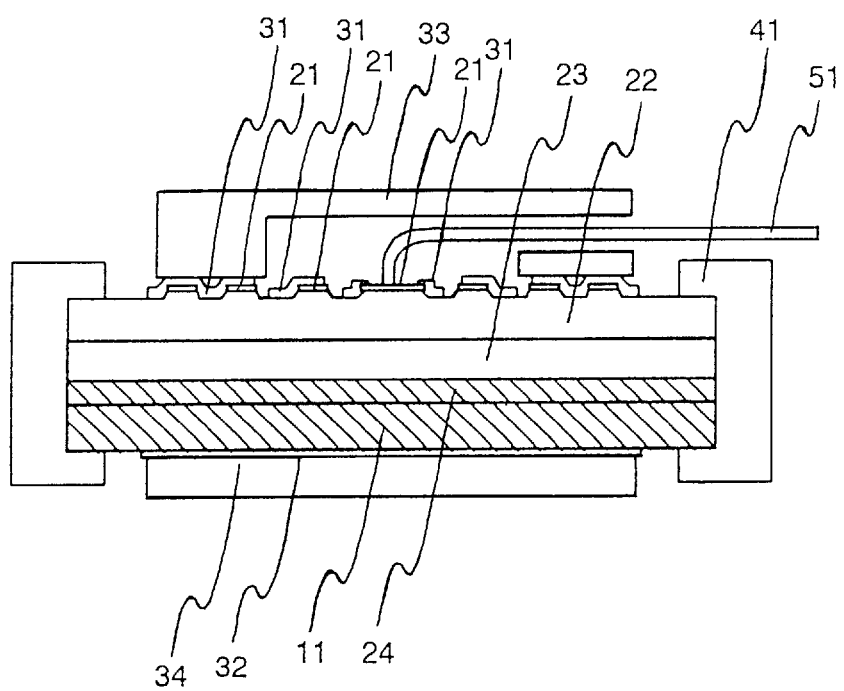
FIG. 1 is a schematic block diagram indicating a cross-section of a light-activated thyristor of a first embodiment of the invention.
Figure 7:
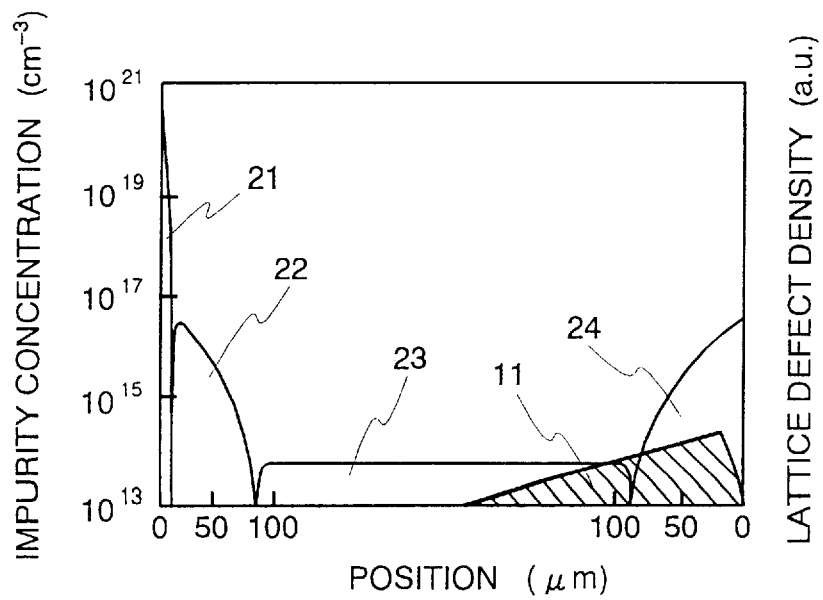
FIG. 7 is a diagram indicating distributions of impurity concentrations and lattice defect in the light-activated thyristor of the first embodiment of the invention.

FIG. 1 shows a cross-sectional view of a light-activated thyristor according to the first embodiment of the invention, and FIG. 7 shows distributions of impurity concentration and lattice defect density in the thyristor of the first embodiment of the invention.

The thyristor of this embodiment of the invention has a four layered structure of n-emitter layer 21, p-base layer 22, n-base layer 23 and p-emitter layer 24. Cathode electrode 31 is in press contact with an upper electrode post via upper intermediate electrode plate 33, and anode electrode 32 is in press contact with a lower electrode post via lower intermediate electrode plate 34. Side portions of the device are machined and covered by passivation film 41 in order to prevent discharge and lowering of breakdown voltage. Further, light guide 51 is provided to admit a light signal therethrough under control of a control circuit to trigger the thyristor into a conduction state in the order of a light-triggered thyristor, an amplifying thyristor and a main thyristor. In this arrangement, an electrode at the light triggered thyristor and one at the amplifying thyristor are auxiliary electrodes for controlling conduction state of the main thyristor.

In this embodiment of the invention, lattice defect region 11 is formed under control such that lifetime of carriers flowing in the depth direction of the substrate from p-emitter layer 24 toward n-emitter layer 21 is shortened on the side of p-emitter layer 24. A maximum value of this lattice defect region 11 is preferred to be in a region at which a depletion layer will not arrive when a rated voltage is applied. Namely, by arranging a position at which the lattice defect becomes maximum in a region at which the depletion layer will not arrive when the rated voltage is applied, a problem of an increased leakage current will become negligible. Thereby, by arranging such that a maximum value of lattice defect region 11 is on the side of anode electrode 32, and that quantities of lattice defect on the cathode side are decreased gradually, it becomes possible for the carrier density in conduction state in the direction from p-emitter layer 24 in which its carrier density is high to n-emitter layer 21 in which its carrier density is low to become constant, and for reverse recovery charge $Q_r$ to be reduced effectively without increasing ON-state voltage $V_T$.

For the purpose of comparison, a result of our study of a case where a lattice defect is introduced locally will be described in the following.

Figure 2:
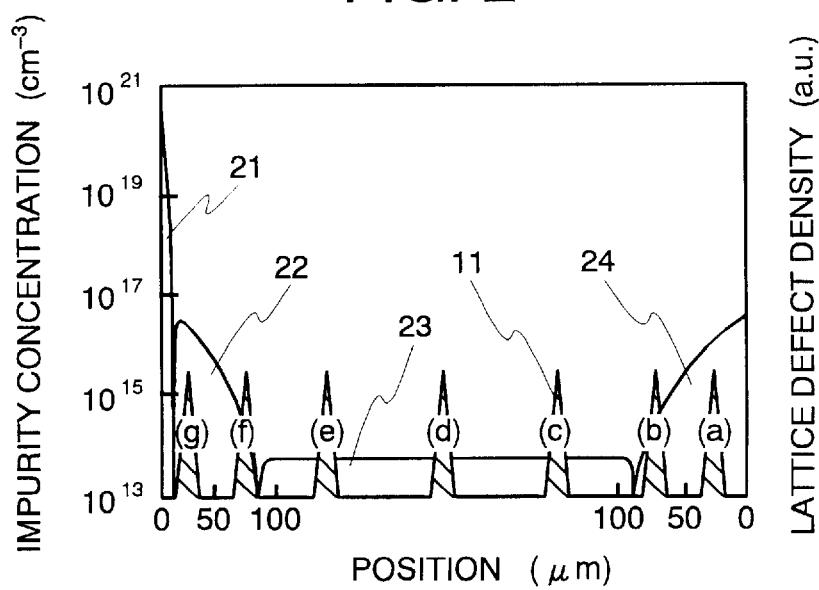
FIG. 2 is a diagram indicating a distribution of impurity concentrations and positions of lattice defect in the thyristor.

In FIG. 2 is shown an example of distribution of impurity concentration in the thyristor which has a four layered structure of n-emitter layer 21, p-base layer 22, n-base layer 23 and p-emitter layer 24. Portions marked (a) to (g) are regions in which a lattice defect is introduced.

Figure 3:
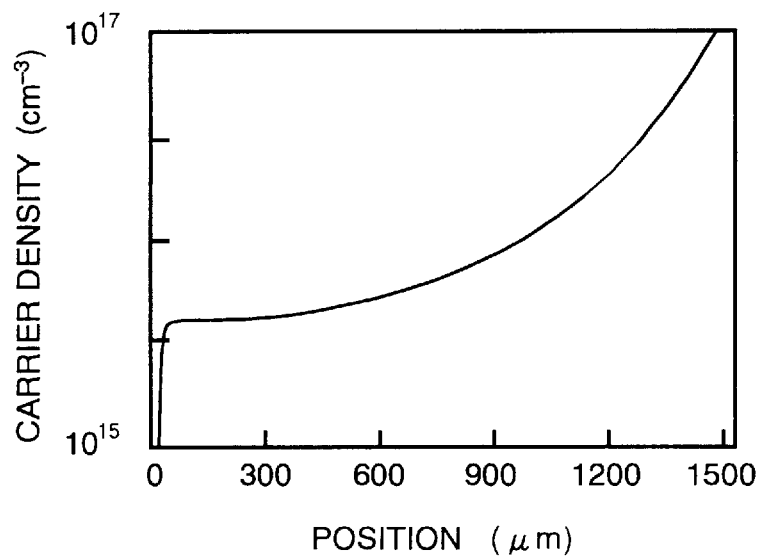
FIG. 3 is a diagram indicating a distribution of carrier density in the thyristor in conduction state.

FIG. 3 is a diagram indicating a distribution of carrier density in the thyristor in conduction state when lifetime control is not applied. Carrier density in conduction state on the n-emitter side is low since a so-called emitter shorted structure is employed in which n-emitter layer 21 and p-base layer 22 is locally shorted by the cathode electrode.

Figure 4:
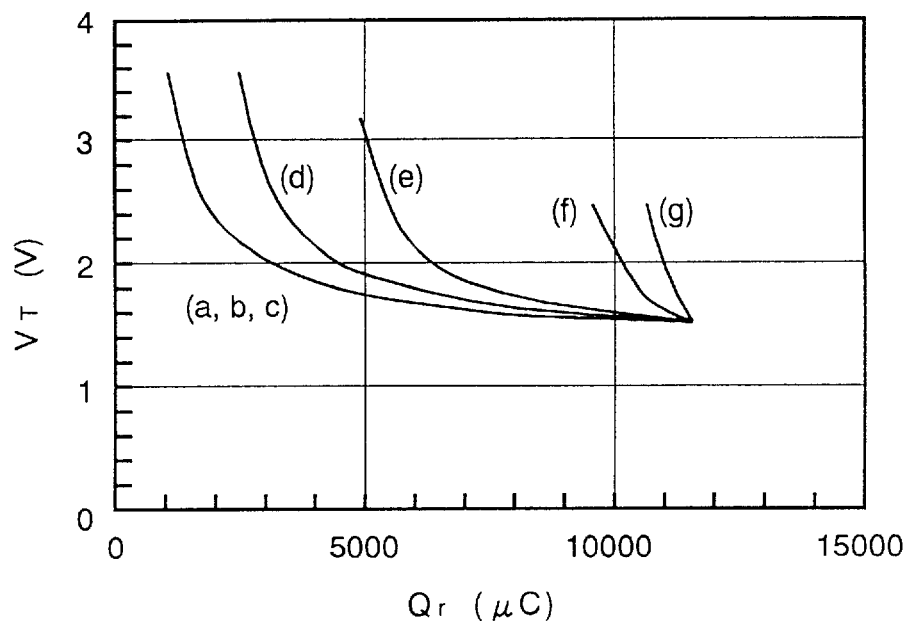
FIG. 4 is a diagram indicating a relationship between ON-state voltage $V_T$ and reverse recovery charge $Q_r$ when a low lifetime region is varied in the depth direction.
Figure 5:
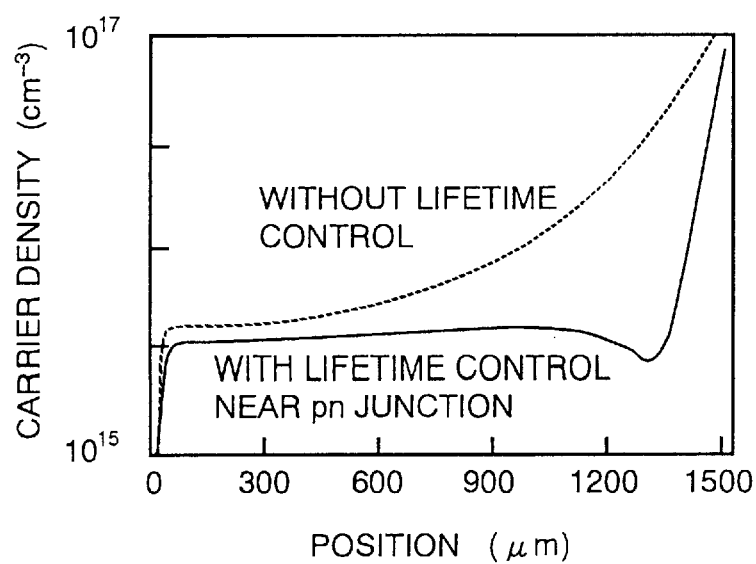
FIG. 5 is a diagram indicating a distribution of carrier density in a thyristor in conduction state in which a low lifetime region is provided locally in the vicinity of pn junction on the anode side.
Figure 6:
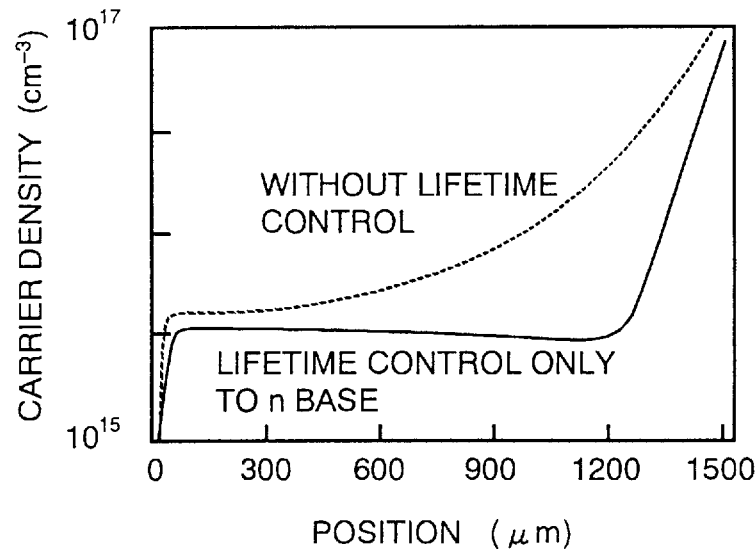
FIG. 6 is a diagram indicating a distribution of carrier density in a thyristor in conduction state in which a low lifetime region is provided only in the n-base layer.

FIG. 4 shows results of calculations of a relationship between ON-state voltage $V_T$ and reverse recovery charge $Q_r$ for each case where each short lifetime region is formed in each area marked with slant lines in FIG. 2, wherein a width of each short lifetime region corresponding to lattice defect region 11 is set at 20 $\mu$m. Depending on a position of lattice defect region 11, a relationship between ON-state voltage $V_T$ and reverse recovery charge $Q_r$ differs as indicated in FIG. 4. It can be known from the drawing that in the cases of (a), (b) or (c) where a short lifetime region corresponding to lattice defect region 11 is formed within p-emitter layer 24 or on the side of p-emitter layer within n-base layer 23, reverse recovery charge $Q_r$ can be reduced while suppressing the increase of ON-state voltage $V_T$. On the other hand, in the cases of (d), (e), (f) or (g) where a short lifetime region is formed toward n-emitter layer 21, reverse recovery charge $Q_r$ cannot be reduced effectively, and OnON-state voltage $V_T$ would increase inevitably. Since these short lifetime regions cause such regions having a low carrier density in conduction state further to reduce their carriers, a resistance component which is in inverse proportion to carrier density is caused to increase, thereby consequently increasing ON-state voltage $V_T$.

Thereby, it can be understood from the results of FIG. 4 that by shortening lifetime on the side of p-emitter layer where the carrier density in conduction state is high, the reverse recovery charge can be effectively reduced while suppressing an increase of ON-state voltage $V_T$. Thereby, in order to effectively reduce reverse recovery charge $Q_r$, it becomes necessary for the carrier density in conduction state to be constant over an area from p-emitter layer 24 to n-emitter layer 21.

Figure 8:
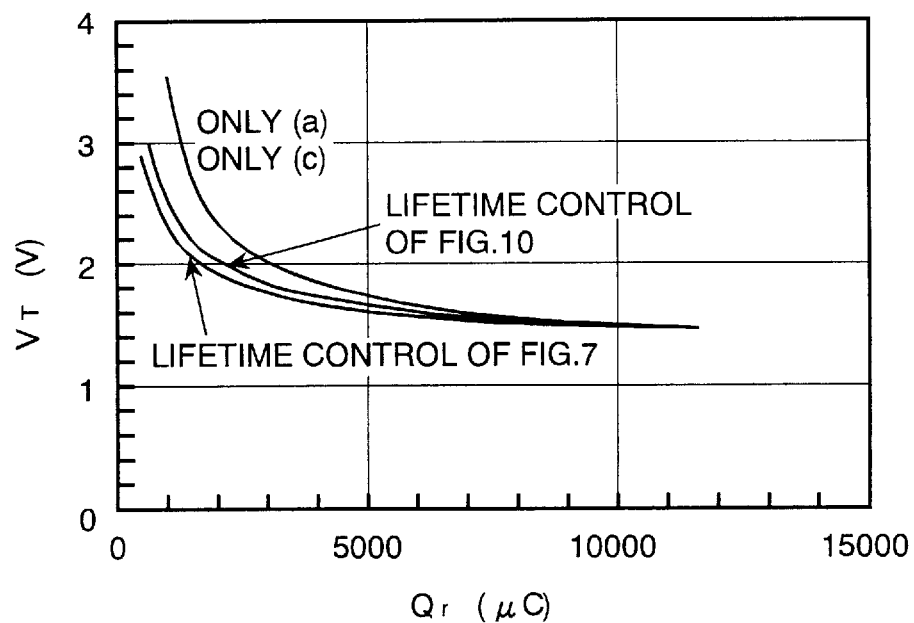
FIG. 8 is a diagram indicating a relationship between ON-state voltage $V_T$ and reverse recovery charge $Q_r$ of the light-activated thyristor of the first embodiment of the invention.
Figure 9:
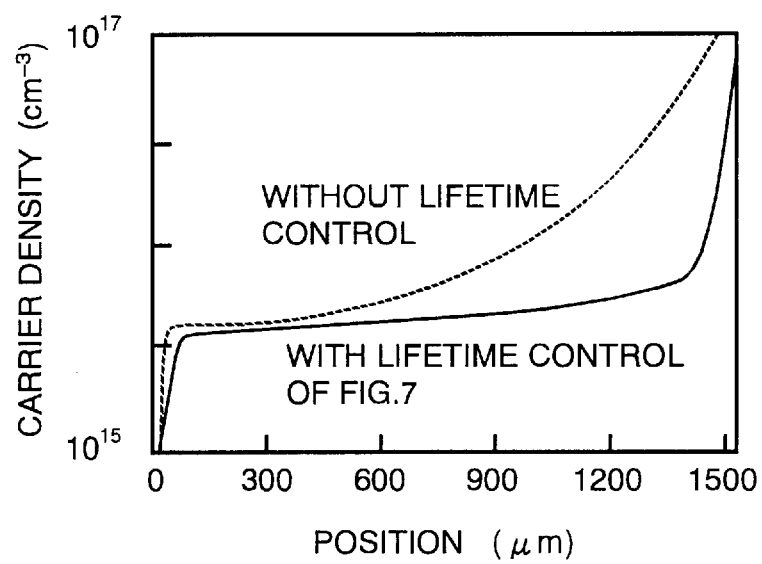
FIG. 9 is a diagram indicating a distribution of carrier density in the light-activated thyristor in conduction state of the first embodiment of the invention.

Next, characteristics of this embodiment of the invention will be compared with the results of the study described above. In FIG. 8 are shown relationships between ON-state voltage $V_T$ and reverse recovery charge $Q_r$. In the drawing of FIG. 8, cases of (a) alone and (c) alone indicated in FIG. 2 where a short lifetime region is provided locally are also shown for comparison. As indicated in FIG. 8, in the case of the first embodiment of FIG. 7, its reverse recovery charge $Q_r$ can be reduced while suppressing the increase of its ON-state voltage $V_T$ more effectively than the cases of (a) or (c) alone where a short lifetime region is locally provided.

As means for providing lattice defect region 11 thereby to form a short lifetime region, there is known a method of continuous irradiation of proton or helium ion which has a wide defect region. Irradiation of proton at approximately 15 MeV will produce a lattice defect region of about 50 $\mu$m. This irradiation may be repeated plural times in order to have a preferred lattice defect. Another method of repeating proton irradiation is such that p-emitter layer 24 is irradiated to have a large gross amount of lattice defects therein, and n-base layer 23 is irradiated to have its gross amount of lattice defects to be reduced gradually.

Figure 12:
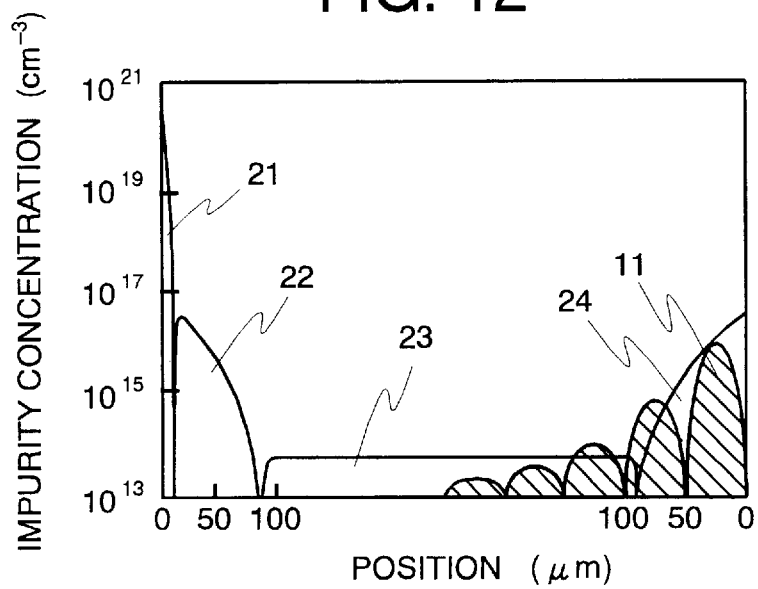
FIG. 12 is a diagram indicating a distribution of lattice defect in a light-activated thyristor which is a modification of the first embodiment of the invention.

With reference to FIG. 12, a distribution of lattice defects in a modified version of the first embodiment of FIG. 7 is depicted in which a plurality of lattice defect regions each having a pitch of 50 $\mu$m are introduced in the depth direction of its substrate. Irradiation is carried out such that a maximum value of lattice defects falls within an area in p-emitter layer 24 as far as to which a depletion layer will not reach, and that irradiation into areas on the side of n-base layer 23 is gradually decreased. A value of lifetime at the maximum value of lattice defects is set, for example, at $\frac{1}{10}$ of a value of lifetime in the area in p-emitter layer 24 in which its lifetime is not controlled.

Figure 10:
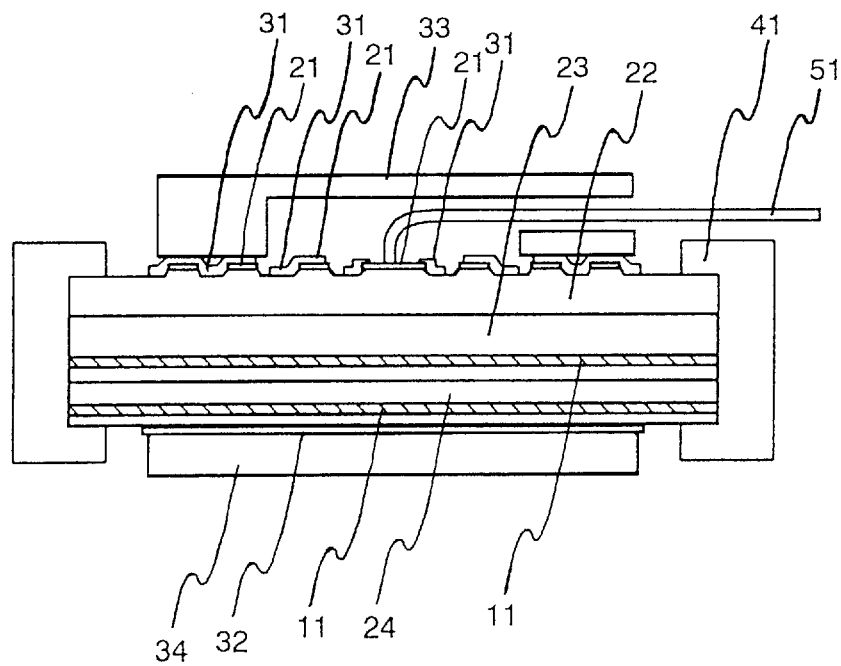
FIG. 10 is a block diagram indicating a cross-section of a light-activated thyristor of a second embodiment of the invention.

With reference to FIG. 10, a cross-section of a thyristor according to the second embodiment of the invention is shown. In the drawing of FIG. 10, the same reference numbers refer to the same elements as in FIG. 1.

The second embodiment of the invention is characterized by comprising lattice defect regions 11 in p-emitter layer 24 and n-base layer 23. Lattice defect region 11 to be formed within p-emitter layer 24 is provided in an area within p-emitter layer 24 and outside a depletion layer which extends when a rated voltage is applied. Thereby, a leakage current under blocking condition will not increase. Further, a width of lattice defect region 11 in this case is set at 10–20 $\mu$m, and a value of lifetime due to this lattice defect is set at $\frac{1}{20}$ of lifetime in other areas within p-emitter layer 24. Further, also within n-base layer 23, lattice defect region 11 is introduced. In this case, a width of lattice defect region 11 is set at 50–100 $\mu$m, and a value of lifetime due to this lattice defect is set at $\frac{1}{2}$ of lifetime in other areas within n-base layer 23.

If a width of lattice defect region 11 is 50 $\mu$m or more, an increase in the leakage current is negligible. However, when the width of lattice defect region 11 is less than 50 $\mu$m, a value of lifetime due to this lattice defect must be reduced to $\frac{1}{10}$, and a rapid increase in the leakage current occurs when a depletion region extends to lattice defect region 11when the rated voltage is applied, thereby, a predetermined breakdown voltage cannot be ensured.

Figure 11:
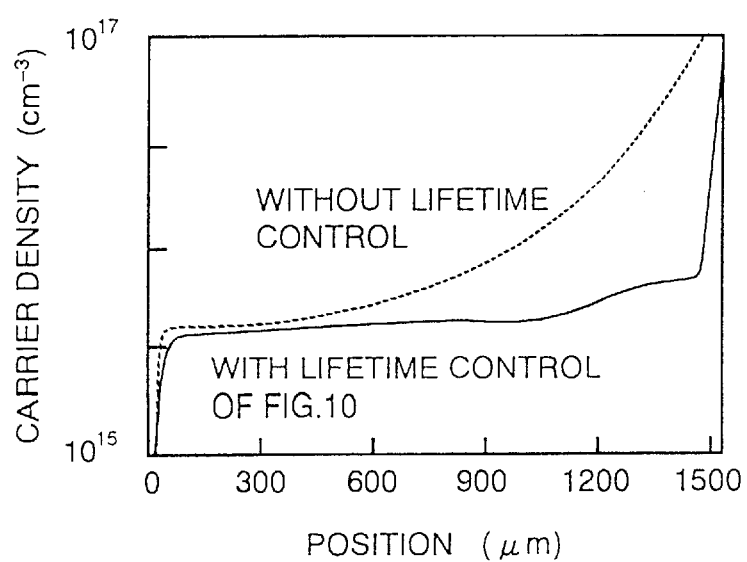
FIG. 11 is a diagram indicating a distribution of carrier density in the light-activated thyristor in conduction state of the second embodiment of the invention.

FIG. 11 shows a distribution of carrier density in conduction state according to the second embodiment of the invention. Quantities of lattice defect region 11 to be formed in p-emitter layer 24 and n-base layer 23 are arranged such that a carrier density in conduction state becomes larger in p-emitter layer 24, and smaller in n-base layer 23, thereby, the carrier density in conduction state becomes substantially constant from the side of anode electrode 32 to the side of cathode electrode 31. Thereby, reverse recovery charge $Q_r$ can be reduced effectively without causing OnON-state voltage $V_T$ to increase. Further, by providing lattice defect region 11 formed in n-base layer 23 at a position which is to the side of p-emitter layer 24 than the center of n-base layer 23, reverse recovery charge $Q_r$ can be most effectively reduced.

FIG. 8 also indicates a relationship between ON-state voltage $V_T$ and reverse recovery charge $Q_r$ for the second embodiment of FIG. 10. Almost the same relationship as for the first embodiment of FIG. 7 is observed. Therefore, it can be understood that the second embodiment also can reduce reverse recovery charge reverse recovery charge $Q_r$ while suppressing ON-state voltage $V_T$ from increasing.

As means for providing lattice defect region 11 in this instant embodiment of the invention, a method to irradiate proton or helium ion can be used. It is desirable for a lattice defect provided in p-emitter layer 24 to have a narrow defect region. In order to form a lattice defect region, for example, of 10 $\mu$m, irradiation of protons at about 5 MeV can be applied. On the other hand, it is desirable for a lattice defect provided in n-base layer 23 to have a broader defect region. In order to form a lattice defect region, for example, of 50 $\mu$m, irradiation of protons at about 15 MeV can be applied.

Further, as will be described later, such a method to irradiate protons or helium ions can be utilized thereby quantity of lattice defect becomes maximum in an area within p-emitter layer 24 as far as to which a depletion layer will not extend from the cathode side.

Figure 13:
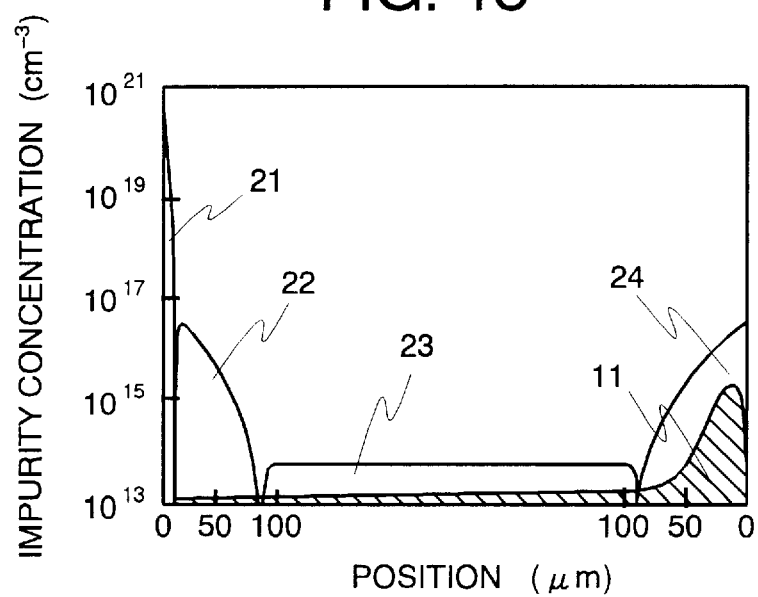
FIG. 13 is a diagram indicating distributions of impurity concentration and lattice defects in a light-activated thyristor of a third embodiment of the invention.

Distributions of impurity concentration and lattice defect in a thyristor of a third embodiment of the invention are indicated in FIG. 13. A maximum value in this lattice defect region 11 is preferably in an area as far as to which a depletion layer will not reach when the rated voltage is applied. By providing a maximum lattice defect position in such an area, an increase in the leakage current will become negligible.

Figure 14:
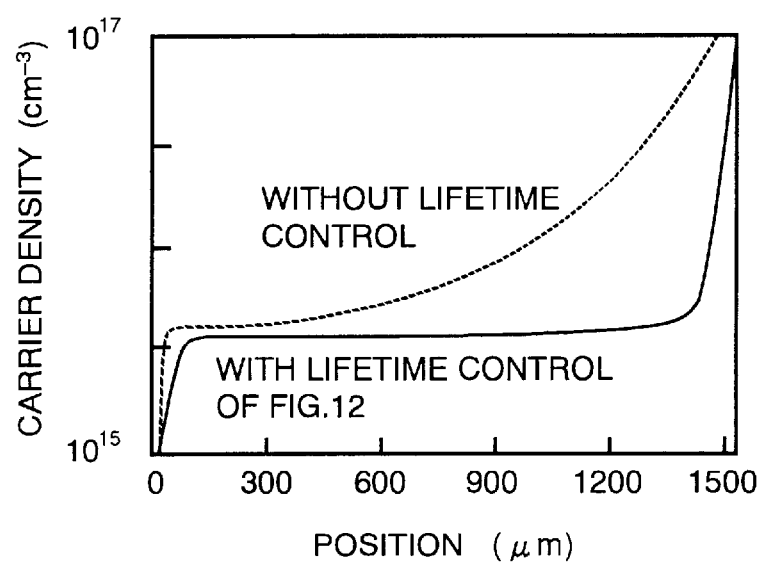
FIG. 14 is a diagram indicating a distribution of carrier density in the light-activated thyristor in conduction state of the third embodiment of the invention.

FIG. 14 indicates distributions of carrier density in conduction state with and without lifetime control in the third embodiment of the invention. In this embodiment, the maximum value of lattice defect region 11 is positioned toward anode electrode 32, and since quantity of lattice defects decreases gradually in the direction of the cathode, it becomes possible for the carrier in conduction state to be substantially constant in the direction from p-emitter layer 24 where its carrier density is high to n-emitter layer 21 where its carrier density is low, thereby, the reverse recovery charge $Q_r$ can be reduced effectively without causing ON-state voltage $V_T$ to increase.

Figure 15:
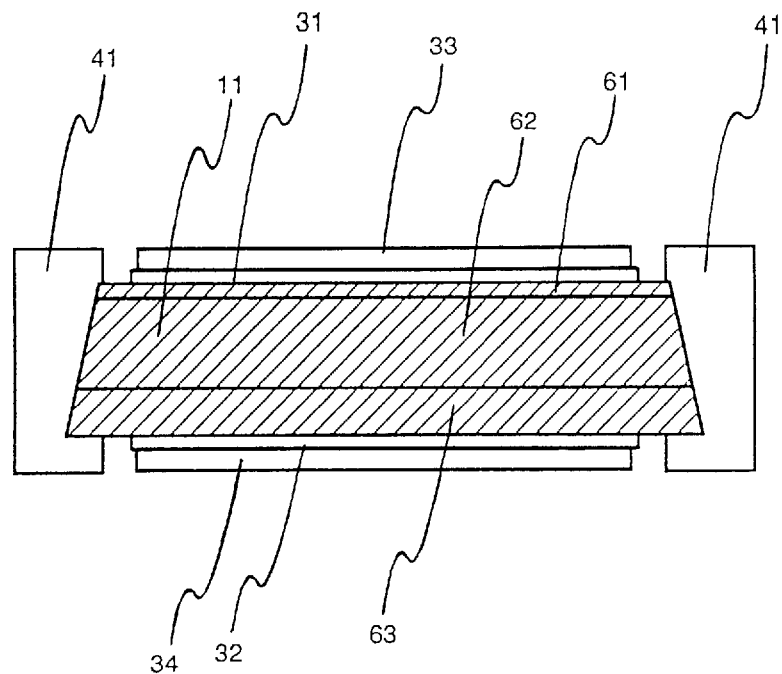
FIG. 15 is a block diagram indicating a cross-section of a diode of a fourth embodiment of the invention.
Figure 16:
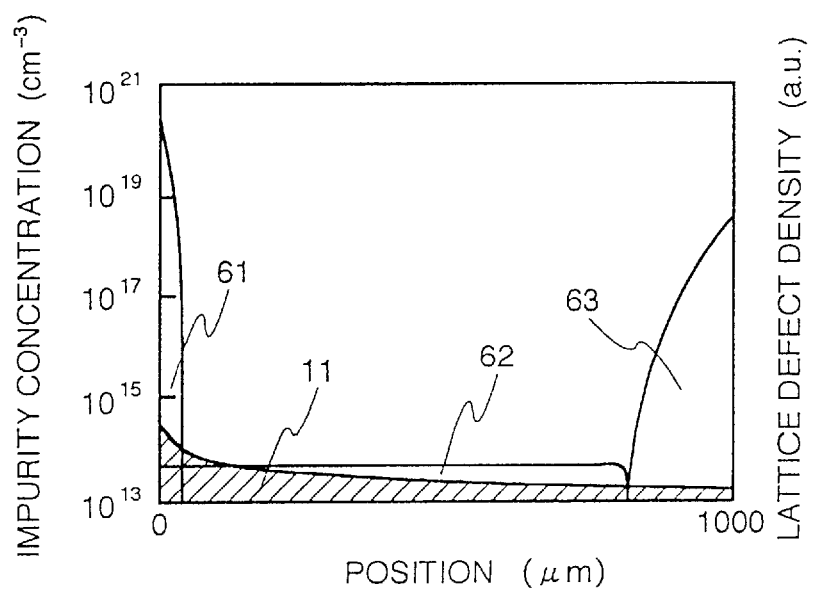
FIG. 16 is a diagram indicating distributions of impurity concentration and lattice defect in the diode of the fourth embodiment of the invention.

With reference to FIG. 15, a cross-section of a diode of a fourth embodiment of the invention is indicated. FIG. 16 shows distributions of impurity concentration and lattice defect in this diode. An impurity concentration distribution in the diode has a structure which includes a high concentration n-layer 61, a low concentration n-layer 62 and p-layer 63. Cathode electrode 31 is press contact with an upper electrode post via upper intermediate electrode plate 33, and anode electrode 32 is press contact with a lower electrode post via lower intermediate electrode 34. Side end portions of the device are machined into a bevel and covered by passivation film 51 in order to prevent discharge and lowering of withstand voltage. In this embodiment, in the depth direction of its substrate is provided lattice defect region 11 extending from the anode electrode 32 to the cathode electrode 31 by irradiation of protons or helium ions. This lattice defect region 11 is formed such that its lattice defect density increases gradually in the direction from the anode side to the cathode side.

Figure 17:
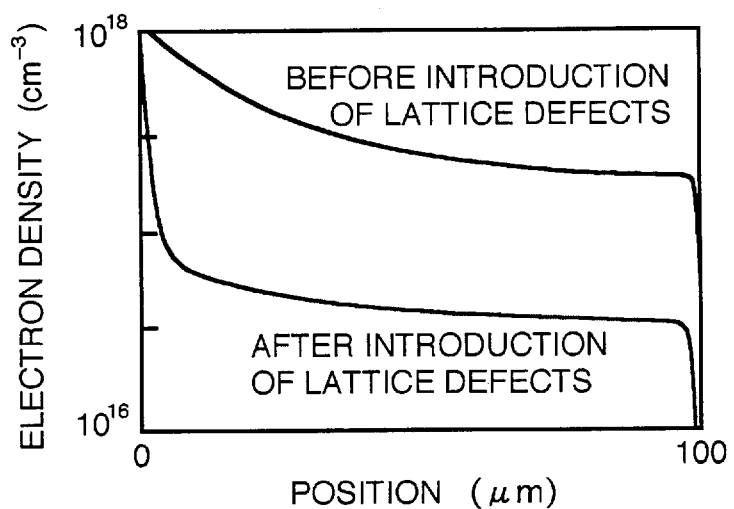
FIG. 17 is a diagram indicating a distribution of carrier density in the diode in conduction state of the fourth embodiment.

FIG. 17 is a diagram indicating results of calculations of distributions of electron densities in the diode of FIG. 16 before and after injection of lattice defects. In a semiconductor device having the distribution of impurity concentration indicated in FIG. 16, since high concentration n-layer 61 is provided, electron density in conduction state before injection of lattice defect is greater on the side of cathode electrode 31. Thereby, by injection of lattice defect in proportion to the electron density in conduction state as shown in FIG. 2, an electron density in conduction state after injection of the lattice defects is substantially flattened over a region from the side of anode electrode 32 within n-layer 62 toward the side of cathode electrode 31. Thereby, ON-state voltage $V_T$ can be suppressed from increasing and reverse recovery charge $Q_r$ can be reduced as well. Namely, the trade-off between the ON-state voltage and the reverse recovery charge can be improved substantially.

Since in the fourth embodiment of the invention, its lifetime is controlled continuously in the depth direction of its substrate, a variation of lifetime in the depth direction of the substrate becomes small, thereby a variation of reverse recovery charge $Q_r$ across the device becomes small.

Further, according to this embodiment, since a quantity of defects present in the depletion region is small and no position is present at which its lattice defect density becomes maximum in the depletion region, its leakage current scarcely increase and a predetermined withstand voltage can be obtained.

Figure 18:
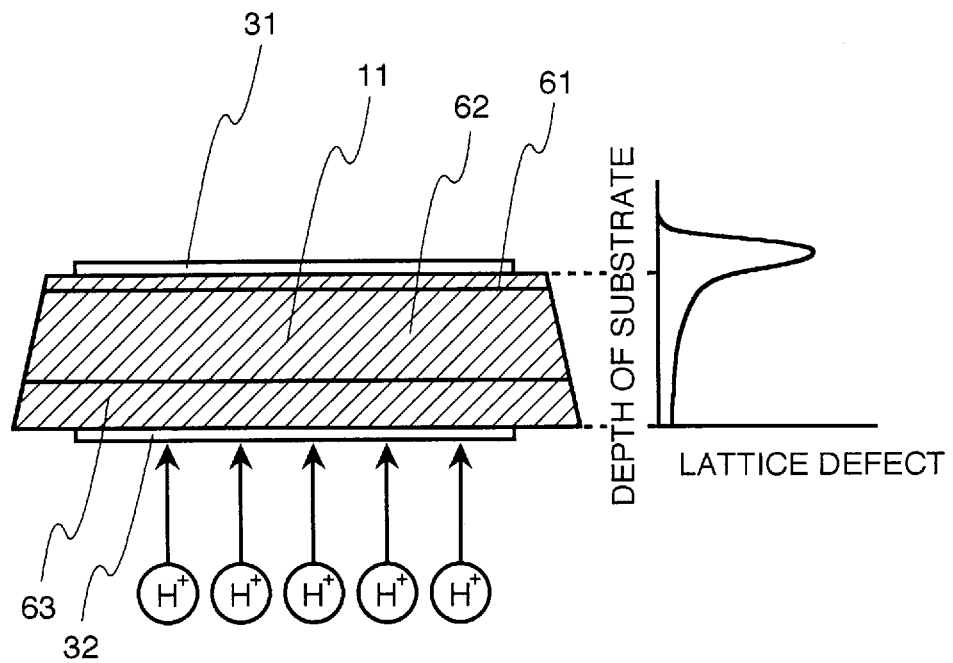
FIG. 18 is a block diagram indicating a method of manufacture of the diode of the fourth embodiment of the invention.

FIG. 18 indicates a method of manufacturing the diode of FIG. 15. By irradiation of protons or helium ions, a lattice defect can be formed locally in a specified region which is determined by a specified injection energy. For example, by proton irradiation at 13 MeV, a maximum value of lattice defect density can be formed at a position of about 1100 $\mu$m in the depth direction of its Si substrate. In the case the thickness of a semiconductor substrate for use in this embodiment is 1000 $\mu$m, by irradiating protons at 13 MeV from the surface of the anode electrode, a lattice defect density in the depth direction of the substrate can be distributed as shown in FIG. 18 such that the lattice defect density increases gradually in the direction from anode electrode 32 to cathode electrode 31, and a position at which the lattice defect density becomes maximum is formed outside the semiconductor substrate. Thereby, an increase of the leakage current becomes negligible.

Further, in the embodiment of FIG. 15, since an impurity density in high concentration n-layer 61 is higher than in p-layer 63, a lattice defect density on the side of high concentration n-layer 61 is increased. However, in the case where an impurity concentration in p-layer 63 is higher than that in high concentration n-layer 61, an electron density distribution in conduction state becomes higher on the side of anode electrode 32. In this case, by irradiation of protons or helium ions from the side of cathode electrode 31, its electron density distribution in conduction state substantially can be flattened in the direction from anode electrode 32 within n-layer 62 to cathode electrode 31, thereby, trade-off relationship between ON-state voltage $V_T$ and reverse recovery charge $Q_r$ can be improved substantially.

Figure 19:
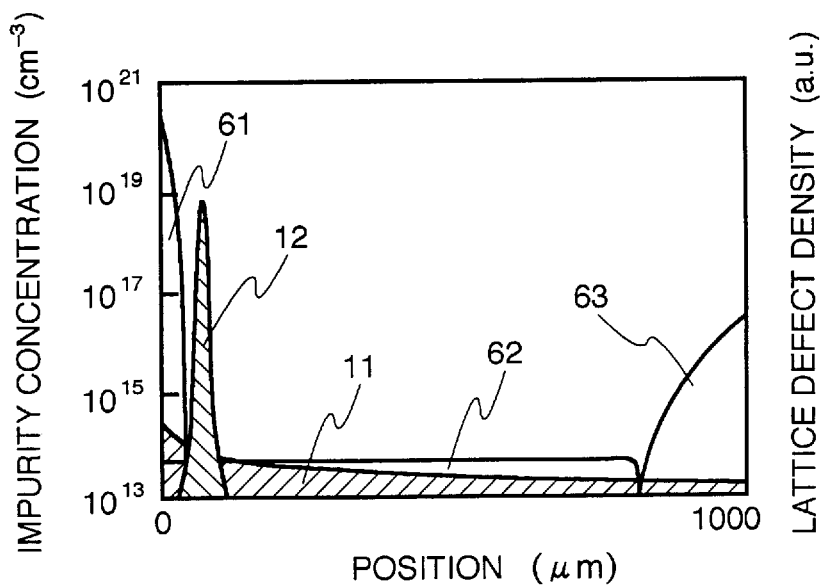
FIG. 19 is a block diagram indicating distributions of impurity concentration and lattice defect in a diode of a fifth embodiment of the invention.
Figure 20:
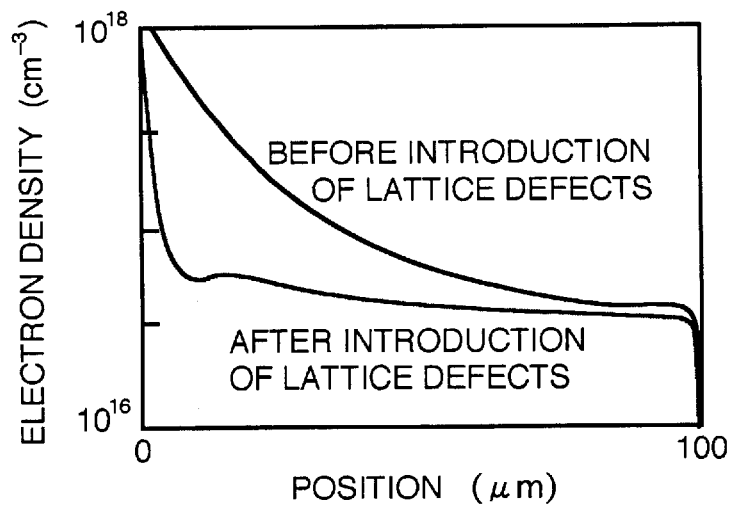
FIG. 20 is a diagram indicating a distribution of carrier density in the diode in conduction state of the fifth embodiment.

FIG. 19 indicates distributions of impurity concentration and lattice defect density in a diode of a fifth embodiment of the invention. The same reference number in FIG. 19 corresponds to the same reference numbers in FIGS. 15 and 16. It is noted that in the distribution of impurity concentrations in this diode, p-layer 63 has a lower concentration compared to that in FIG. 16. In the case where p-layer 63 has a high concentration, its electron density in conduction state prior to lattice defect introduction has a difference of about twofold between anode electrode 32 and cathode electrode 31 as shown in FIG. 17. In contrast, in the case where p-layer 63 has a low concentration, its electron density in conduction state prior to lattice defect introduction is greater by about one order on the side of cathode side within n-layer 62 than on the side of anode electrode 32. According to the proton irradiation method of FIG. 16, a ratio of lattice defects on the side of cathode electrode 31 relative to the side of anode electrode 32 is at most 2–3 times. Thereby, it is not possible to have the electron density to be flattened from the side of cathode electrode 31 within n-layer 62 to the side of anode electrode 32 by means of the proton irradiation method alone of FIG. 16. Therefore, in addition to the above-mentioned means, a region 12 is formed by proton or helium ion irradiation at which its lattice defect density takes a maximum value, outside a depletion region which is formed when a rated voltage is applied to maintain the applied voltage. Thereby, injection of electrons from high concentration n-layer 61 is suppressed so as to provide a distribution of electron densities in conduction state after introduction of lattice defects as shown in FIG. 20, in which its distribution is flattened from the side of cathode electrode 31 within n-layer 62 to the side of anode electrode 32. Thereby, it becomes possible to minimize reverse recovery charge $Q_r$ effectively while suppressing ON-state voltage $V_T$ from increasing.

Figure 21:
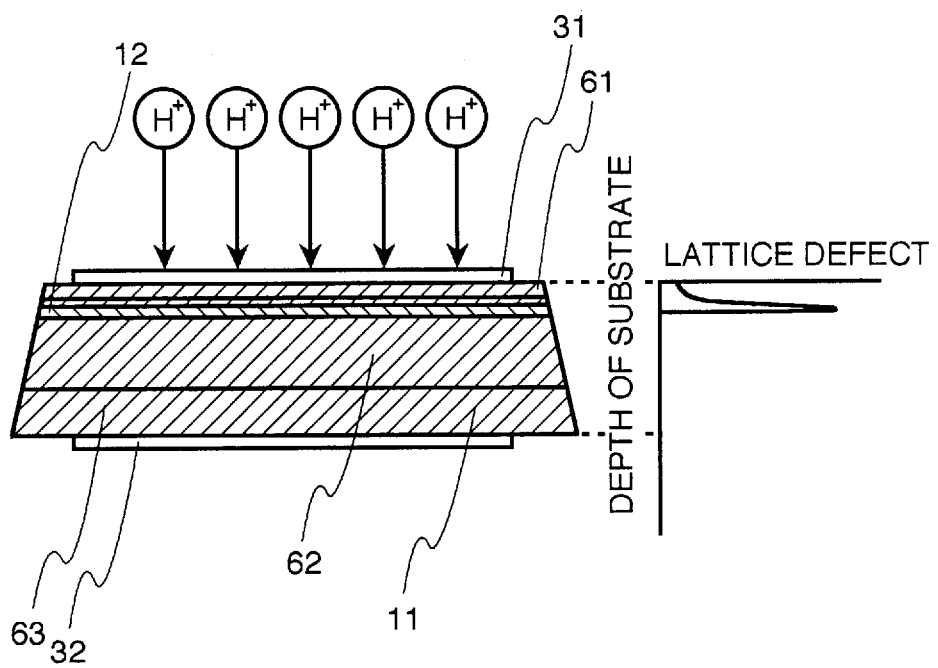
FIG. 21 is a block diagram indicating a method of manufacture of the diode of the fifth embodiment.

FIG. 21 shows a method of manufacture of the diode of FIG. 19. As means for forming this lattice defect distribution, two-stage proton irradiation is applied. At first, proton irradiation is carried out so as to position a maximal lattice defect density to be formed outside the semiconductor substrate. Then, proton irradiation with a lower irradiation energy of approximately 1 MeV is carried out from the side of cathode electrode 31 to form the region 12 having the maximal lattice defect density at a position of 10 μm from the surface of the cathode electrode. According to this method of manufacture using proton irradiation, lifetime can be controlled continuously in the depth direction, thereby appropriate lattice defects in proportion to the electron density distribution in conduction state can be introduced. Thereby, the trade-off relationship between the reverse recovery charge and the on-voltage can be improved substantially. In addition, since only a proton irradiation source is used as a radiation source, the process of manufacture is simplified.

Further, as another method of manufacture of the diode of FIG. 19, there is a single-stage proton irradiation method. By irradiating protons at 12 MeV, for example, a maximal value of lattice defect density is formed at a position of approximately 950 μm in the depth direction of a Si substrate. In case a thickness of a semiconductor substrate for use in this embodiment is 1000 μm, by proton irradiation its lattice defect density in the depth direction of the substrate increases gradually in the direction from anode electrode 32 to cathode electrode 31, and its maximal lattice defect density is formed at a position outside a depletion region within low concentration n-layer 62, the depletions region being formed to hold the rated voltage. Thereby, the leakage current will not increase.

Figure 22:
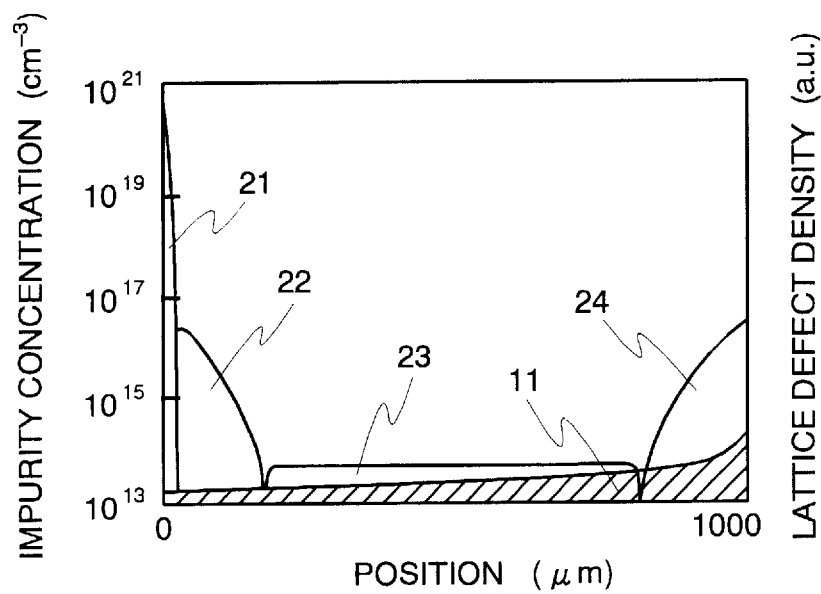
FIG. 22 is a diagram indicating distributions of impurity concentrations and lattice defect in a light-activated thyristor of a sixth embodiment of the invention.

With reference to FIG. 22, distributions of impurity concentration and lattice defect density in a light-activated thyristor of a sixth embodiment of the invention are shown. The same reference numbers correspond to the same reference numbers in FIGS. 1 and 2. The construction of this light-activated thyristor other than the distribution of lattice defect densities is the same as in FIG. 1.

In this embodiment, a lattice defect region 11 is formed extending in the depth direction of its substrate from the cathode electrode 31 to anode electrode 32 by irradiation of protons or helium ions. This lattice defect region 11 is formed such that its lattice defect density increases gradually from the side of cathode to the side of anode. As a result of our study it is found that in a light-activated thyristor in which n-emitter layer 21 and p-base layer 22 is partially shorted by cathode electrode 31, and in particular, in such a thyristor having a distribution of impurity concentrations as shown in FIG. 22, its carrier density in conduction state prior to introduction of lattice defects increases on the side of the anode electrode, thereby, that after introduction of lattice defect its carrier density in conduction state becomes flattened within n-base layer 23 from the anode electrode side to the cathode electrode side, and thereby that reverse recovery charge $Q_r$ can be reduced without causing ON-state voltage $V_T$ to increase.

In this embodiment of the invention, since its lifetime is controlled continuously in the depth direction of the substrate likewise, fluctuation of reverse recovery charge $Q_r$ among devices is minimized. Further, since a quantity of lattice defect present in the depletion region when a rated voltage is applied is small, and since the position of the maximal lattice defect density does not reside in the depletion region, no increase in the leakage current occurs.

The light-activated thyristor of FIG. 22 is manufactured by irradiating protons at 13 MeV, for example, from the main surface of the cathode assuming the thickness of its semiconductor substrate to be 1000 μm. In this case, its lattice defect density increases gradually in the depth direction of the substrate from the cathode electrode to the anode electrode, and a position of its maximal lattice defect density is formed outside the semiconductor substrate, thereby providing the lattice defect density distribution having lattice defect region 11 indicated in FIG. 22.

Figure 23:
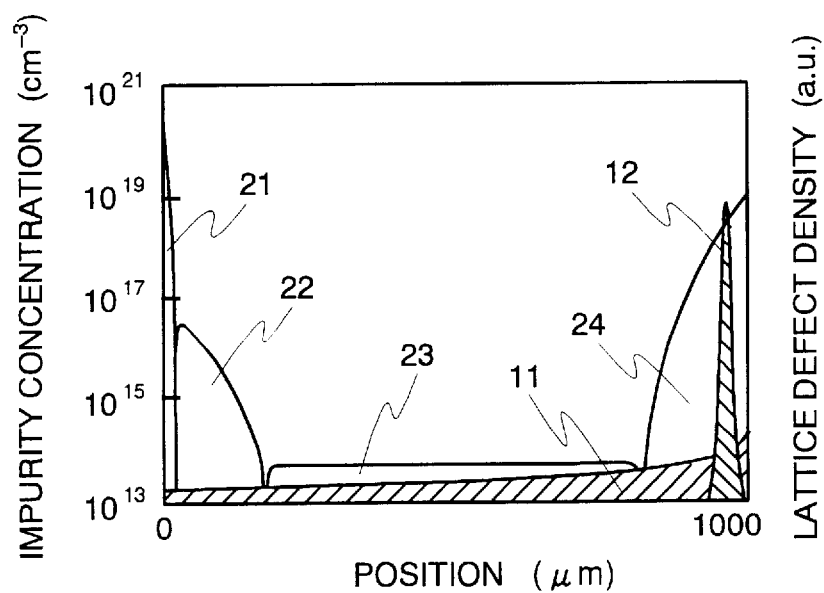
FIG. 23 is a diagram indicating distributions of impurity concentration and lattice defect in a light-activated thyristor of a seventh embodiment of the invention.

With reference to FIG. 23, distributions of impurity concentration and lattice defect density in a light-activated thyristor of a seventh embodiment of the invention are shown. The same reference numbers in FIG. 23 correspond to the same reference numbers in FIGS. 1 and 2. The structure of this thyristor other than its lattice defect region is the same as in FIG. 1. In this embodiment of the invention, a region 12 is formed at a position at which its lattice defect density becomes maximum outside a depletion region which is formed to hold a rated voltage applied, by proton or helium ion irradiation. In the distribution of impurity concentrations in this light-activated thyristor, p-emitter layer 24 has a higher concentration compared to that in the sixth embodiment of FIG. 22. According to the study of the inventors, in the case where p-emitter layer 24 has a higher concentration, an electron density in conduction state prior to introduction of lattice defect is higher by one order on the side of anode electrode 32 within n-base layer 23 compared to that on the side of cathode electrode 31. Thereby, by the proton irradiation method alone of FIG. 22, it is not possible for the hole density to be flattened from the side of cathode electrode 31 to the side of anode electrode 32 within n-base layer 23. Thereby, in addition to the above-mentioned means, it is arranged such that a region 12 in which a maximal lattice defect density takes place is formed outside the depletion region which is formed to hold the rated voltage by proton or helium ion irradiation. Thereby, injection of electrons from p-emitter layer 24 is suppressed, thereby, a distribution of carrier density in conduction state after introduction of lattice defect is arranged to become flat over an area from the side of cathode electrode to the side of anode electrode within n-base layer 23. Thereby, it becomes possible effectively to reduce reverse recovery charge $Q_r$ while suppressing ON-state voltage $V_T$ from increasing.

As a method for obtaining a thyristor having the lattice defect distribution of FIG. 23, a two-stage proton irradiation method is employed. Namely, as described in the fourth embodiment of the invention, proton irradiation is carried out such that a position of a maximal lattice defect density is formed outside the semiconductor substrate, then, the second proton irradiation at a low irradiation energy of approximately 1 MeV is carried out from the side of anode electrode 32 such that the region 12 having a maximal lattice defect density is formed at a position of 10 μm from the surface of the cathode electrode.

Further, as another method for obtaining the above thyristor, a single-stage proton irradiation method can be used. Assuming the thickness of the semiconductor substrate to be 1000 μm, proton irradiation at 12 MeV will provide a distribution of lattice defect in the depth direction of the substrate as indicated in FIG. 23, in which its lattice defect density increases gradually in the direction from cathode electrode 31 to anode electrode 32, and has a maximal lattice defect density formed at a position outside the depletion region within p-emitter layer 24, which is formed when a rated voltage is applied. Thereby, no increase in the leakage current occurs.

As has been described above, according to the present invention, reverse recovery charge $Q_r$ can be reduced efficiently while suppressing ON-state voltage $V_T$ from increasing.

What we claim is:

1. A semiconductor device comprising a pair of main surfaces, at least one pn junction between the main surfaces, a first main electrode formed on one of the main surfaces, a second main electrode formed on the other of the main surfaces, wherein a conduction path is formed inside said semiconductor device between said first and second main electrodes through said pn junction, and a lattice defect formed along the entire conduction path between said first and second main electrodes, wherein the density of said lattice defect increases gradually in a direction from the first main electrode to the second main electrode.

2. A semiconductor device according to claim 1, wherein the maximum value of lattice defect density accuss at a position outside a depletion region which is formed to hold a rated voltage.

3. A semiconductor device comprising a first emitter layer of a first conductivity type, a first base layer of a second conductivity type adjacent to the first emitter layer, a second base layer of the first conductivity type adjacent to the first base layer, a second emitter layer of the second conductivity type adjacent to the second base layer, a first main electrode formed on the first emitter layer, a second main electrode formed on the second emitter layer, wherein a conduction path is formed inside said semiconductor device between said first and second main electrodes through said first and second emitter layers and said first and second base layers, and a lattice defect formed in said first and second emitter layers and said first and second base layers such that said lattice defect is formed along the entire conduction path between said first and second main electrodes, wherein the density of the lattice defect increases gradually in a direction from the first main electrode to the second main electrode.

4. A semiconductor device according to claim 3, wherein the maximum value of lattice defect density accuss at a position outside a depletion region which is formed between said second base layer and said second emitter layer to hold a rated voltage.

5. A semiconductor device according to claim 3, having a carrier lifetime which decreases in a direction from the first main electrode to the second main electrode.

6. A semiconductor device according to claim 3, wherein a carrier lifetime in at least a predetermined portion of the conduction path decreases in a direction from the first main electrode to the second main electrode.

7. A semiconductor device according to claim 3, further comprising:

a first region within the second emitter layer and in the conduction path, wherein a carrier lifetime in said first region in said conduction path is shorter than a carrier lifetime in other parts within the second emitter layer; and a second region within the second base layer and in the conduction path, wherein a carrier lifetime in said second region in said conduction path is shorter than a carrier lifetime in other parts within the second base layer, and wherein the carrier lifetime in the first region in the conduction path is shorter than the carrier lifetime in the second region in the conduction path.

8. A semiconductor device according to claim 7, wherein said first region is formed outside a depletion region which is formed within the second emitter layer when a rated voltage is applied to said semiconductor device.

9. A semiconductor device according to claim 7, wherein said second region within the second base layer is formed on the side of said second emitter layer from a center of said second base layer.

10. A semiconductor device according to claim 7, wherein a carrier lifetime is controlled by introduction of a lattice defect into a semiconductor layer.

11. A semiconductor device according to claim 10, wherein a total amount of a lattice defect in said first region is greater than a total amount of a lattice defect in said second region by 1–10 times.

12. A semiconductor device according to claim 3, further comprising a region formed in the conduction path and extending in a direction from the second emitter layer to the first emitter layer, wherein a carrier lifetime in said region increases gradually and continuously in the same direction.

13. A semiconductor device according to claim 12, wherein said region in which said carrier lifetime increases gradually and continuously is formed at a position on the side of said second emitter with respect to a center of said second base layer.

14. A semiconductor device according to claim 12, wherein a carrier lifetime in a portion within the second emitter layer within said region in which said carrier lifetime increases gradually and continuously is shorter than a carrier lifetime in a portion within the second base layer within said region.

15. A semiconductor device according to claim 12, wherein said lifetime is controlled by introduction of a lattice defect into a semiconductor layer.

16. A semiconductor device according to claim 15, wherein a position of the maximum value of the lattice defect in said region in which said carrier lifetime increases gradually and continuously is placed outside a depletion region which is formed within the second emitter layer when a rated voltage is applied to said semiconductor device.

17. A semiconductor device according to claim 1, wherein the lattice defect is formed along substantially the entire length of the conduction path in a direction from the first main electrode to the second main electrode.

18. A semiconductor device according to claim 3, wherein the lattice defect is formed along substantially the entire length of the conduction path in a direction from the first main electrode to the second main electrode.

* * * * *